United States Patent
Seo et al.

(10) Patent No.: US 11,316,002 B2
(45) Date of Patent: *Apr. 26, 2022

(54) UNIT PIXEL AND ORGANIC LIGHT EMITTING DISPLAY DEVICE INCLUDING THE SAME

(71) Applicant: Samsung Display Co., Ltd., Yongin-si (KR)

(72) Inventors: Ilhun Seo, Asan-si (KR); Yun-Mo Chung, Yongin-si (KR); Jae-Wook Kang, Hwaseong-si (KR); Hojin Yoon, Hwaseong-si (KR); Daewoo Lee, Hwaseong-si (KR); Minseong Yi, Hwaseong-si (KR); Tak-Young Lee, Anyang-si (KR); Miyeon Cho, Seoul (KR)

(73) Assignee: Samsung Display Co., Ltd.

( * ) Notice: Subject to any disclaimer, the term of this patent is extended or adjusted under 35 U.S.C. 154(b) by 57 days.

This patent is subject to a terminal disclaimer.

(21) Appl. No.: 16/879,661

(22) Filed: May 20, 2020

(65) Prior Publication Data
US 2020/0279904 A1 Sep. 3, 2020

Related U.S. Application Data

(62) Division of application No. 15/960,111, filed on Apr. 23, 2018, now Pat. No. 10,700,150.

(30) Foreign Application Priority Data

Jun. 14, 2017 (KR) ........................ 10-2017-0075135

(51) Int. Cl.
*H01L 27/32* (2006.01)
*H01L 27/12* (2006.01)

(52) U.S. Cl.
CPC ...... *H01L 27/3276* (2013.01); *H01L 27/1255* (2013.01); *H01L 27/3248* (2013.01); *H01L 27/3265* (2013.01)

(58) Field of Classification Search
CPC ............. H01L 27/3265; H01L 27/1255; H01L 27/3248; H01L 27/3276
See application file for complete search history.

(56) References Cited

U.S. PATENT DOCUMENTS

| | | | | |
|---|---|---|---|---|
| 2009/0166637 | A1* | 7/2009 | Park | H01L 27/1255 257/71 |
| 2012/0162050 | A1* | 6/2012 | Zhan | G06F 1/00 345/55 |

(Continued)

FOREIGN PATENT DOCUMENTS

| | | |
|---|---|---|
| KR | 10-0754126 B1 | 8/2007 |
| KR | 10-0813413 B1 | 3/2008 |

(Continued)

*Primary Examiner* — Aaron J Gray
(74) *Attorney, Agent, or Firm* — Innovation Counsel LLP

(57) ABSTRACT

A unit pixel includes a circuit structure, first and second wiring patterns, an interlayer insulating layer, a planarization layer, and a light emission structure. The first wiring pattern disposed on the circuit structure has a first bump structure. The interlayer insulating layer covers the circuit structure and the first wiring pattern. The second wiring pattern disposed on the interlayer insulating layer overlaps the first wiring pattern and has a second bump structure. The planarization layer covers the interlayer insulating layer and the second wiring pattern and includes a via-hole exposing at least a portion of the second wiring pattern. The light emission structure contacts the second wiring pattern through the via-hole. The first and second wiring patterns and the interlayer insulating layer form a capacitor, the light emission structure includes an OLED, and the capacitor is directly connected to an anode of the OLED.

14 Claims, 5 Drawing Sheets

(56) References Cited

U.S. PATENT DOCUMENTS

2014/0034923 A1* 2/2014 Kim .................... H01L 27/3265
257/40
2016/0163780 A1* 6/2016 Park .................... H01L 27/1222
257/40

FOREIGN PATENT DOCUMENTS

KR       10-1041141 B1    6/2011
KR    10-2016-0119909 A   10/2016

* cited by examiner

UNIT PIXEL AND ORGANIC LIGHT EMITTING DISPLAY DEVICE INCLUDING THE SAME

CROSS-REFERENCE TO RELATED APPLICATION(S)

This application is a divisional application of U.S. patent application Ser. No. 15/960,111 filed Apr. 23, 2018, which claims priority under 35 USC § 119 to Korean Patent Application No. 10-2017-0075135, filed on Jun. 14, 2017 in the Korean Intellectual Property Office (KIPO), the disclosure of which is incorporated herein in its entirety by reference.

BACKGROUND

1. Technical Field

Exemplary embodiments of the present disclosure relate generally to a display device. More particularly, embodiments of the present inventive concept relate to a unit pixel that emits light using an organic light emitting diode and an organic light emitting display device including the unit pixel.

2. Description of the Related Art

Generally, an organic light emitting display (OLED) device includes a plurality of unit pixels, and each unit pixel has at least one transistor, at least one capacitor, and an organic light emitting diode. The organic light emitting display device controls light emission of each unit pixel by adjusting a current flowing through the organic light emitting diode in each unit pixel. As the capacitance of the capacitor included in each unit pixel increases, higher light emission luminance can be achieved because a loss of a data signal applied to each unit pixel via a data-line is reduced. The capacitance of the capacitor included in each unit pixel may be increased by increasing a size of both electrodes of the capacitor, decreasing a thickness of a dielectric layer disposed between the electrodes of the capacitor, and/or increasing a dielectric constant of the dielectric layer of the capacitor. However, increasing the size of the electrodes of the capacitor may be limited according to design constraints of the unit pixel, decreasing the thickness of the dielectric layer (e.g., an interlayer insulating layer) disposed between the electrodes (e.g., wiring patterns) of the capacitor may result in an electric short circuit, and increasing the dielectric constant of the dielectric layer of the capacitor may require a new material for the dielectric layer. Thus, it is desirable to increase the capacitance of the capacitor included in each unit pixel without changing the size of the electrodes of the capacitor, the thickness of the dielectric layer of the capacitor, and the dielectric constant or the dielectric material of the dielectric layer of the capacitor.

SUMMARY

Some exemplary embodiments of the present disclosure provide a unit pixel of an organic light emitting display device including a capacitor having increased capacitance due to an increased surface area of both electrodes of the capacitor without changing a size of the electrodes.

Some exemplary embodiments provide an organic light emitting display device including the unit pixel.

According to exemplary embodiments, a unit pixel may include a circuit structure, a first wiring pattern disposed on the circuit structure, where the first wiring pattern has a first bump structure, an interlayer insulating layer covering the circuit structure and the first wiring pattern, a second wiring pattern disposed on the interlayer insulating layer, where the second wiring pattern overlaps the first wiring pattern and has a second bump structure corresponding to the first bump structure, a planarization layer covering the interlayer insulating layer and the second wiring pattern and including a via-hole that exposes at least a portion of the second wiring pattern, and a light emission structure contacting the second wiring pattern through the via-hole. The first wiring pattern, the interlayer insulating layer, and the second wiring pattern may form a capacitor, the light emission structure may include an organic light emitting diode, and the capacitor may be directly connected to an anode of the organic light emitting diode.

In exemplary embodiments, the first bump structure may include at least one first protrusion that protrudes in an upward direction.

In exemplary embodiments, the first wiring pattern may include a central region and a stepped portion region, and the first protrusion is disposed only in the central region.

In exemplary embodiments, the first bump structure may include a protrusion structure that is formed on the circuit structure corresponding to the first protrusion and the first wiring pattern that covers the protrusion structure.

In exemplary embodiments, the protrusion structure may include an organic material.

In exemplary embodiments, the organic material may include at least one of polyimide and siloxane.

In exemplary embodiments, the first bump structure may include the first wiring pattern that is formed on the circuit structure and the first protrusion that is formed by etching the first wiring pattern.

In exemplary embodiments, a cross-section of the first protrusion may be a part of a circular shape, a part of an elliptical shape, or a part of a polygonal shape.

In exemplary embodiments, the second bump structure may include at least one second protrusion that protrudes in an upward direction.

In exemplary embodiments, the second wiring pattern may include a central region and a stepped portion region, and the second protrusion may be disposed only in the central region.

In exemplary embodiments, the via-hole may entirely expose the second protrusion.

In exemplary embodiments, the via-hole may expose a portion of the second protrusion.

In exemplary embodiments, the second bump structure may include the interlayer insulating layer that is formed on the first wiring pattern and the second wiring pattern that is formed on the interlayer insulating layer.

In exemplary embodiments, a cross-section of the second protrusion may be a part of a circular shape, a part of an elliptical shape, or a part of a polygonal shape.

In exemplary embodiments, the first wiring pattern may be a data-line pattern or may be connected to the data-line pattern.

In exemplary embodiments, the second wiring pattern may be connected to one electrode of a driving transistor that is included in the circuit structure.

In exemplary embodiments, the first wiring pattern and the second wiring pattern may include a metal.

In exemplary embodiments, the light emission structure may include a first electrode pattern contacting the second wiring pattern through the via-hole, where the first electrode pattern corresponds to the anode of the organic light emitting diode, an organic layer disposed on the first electrode pattern, and a second electrode pattern disposed on the organic layer, where the second electrode pattern corresponds to a cathode of the organic light emitting diode.

According to exemplary embodiments, an organic light emitting display device may include a display panel including a plurality of unit pixels and a panel driving circuit configured to drive the display panel. Each of the unit pixels may include a circuit structure, a first wiring pattern disposed on the circuit structure, where the first wiring pattern has a first bump structure, an interlayer insulating layer covering the circuit structure and the first wiring pattern, a second wiring pattern disposed on the interlayer insulating layer, where the second wiring pattern overlaps the first wiring pattern and has a second bump structure corresponding to the first bump structure, a planarization layer covering the interlayer insulating layer and the second wiring pattern and including a via-hole that exposes at least a portion of the second wiring pattern, and a light emission structure contacting the second wiring pattern through the via-hole. The first wiring pattern, the interlayer insulating layer, and the second wiring pattern may form a capacitor, the light emission structure may include an organic light emitting diode, and the capacitor may be directly connected to an anode of the organic light emitting diode.

In exemplary embodiments, the first bump structure may include at least one first protrusion that protrudes in an upward direction, the second bump structure may include at least one second protrusion that protrudes in the upward direction, and cross-sections of the first protrusion and the second protrusion may be a part of a circular shape, a part of an elliptical shape, or a part of a polygonal shape.

Therefore, a unit pixel according to exemplary embodiments may have a capacitor that is directly connected to an anode of an organic light emitting diode and formed by a first wiring pattern having a first bump structure, an interlayer insulating layer covering the first wiring pattern, and a second wiring pattern overlapping the first wiring pattern and having a second bump structure corresponding to the first bump structure. Thus, the capacitance of the capacitor included in the unit pixel may be effectively increased by increasing a surface area of both electrodes (i.e., the first wiring pattern and the second wiring pattern) of the capacitor using the first bump structure and the second bump structure without changing a size of the electrodes of the capacitor.

In addition, an organic light emitting display device including the unit pixel according to exemplary embodiments may implement (or achieve) sufficient light emission luminance by reducing (or minimizing) a loss of a data signal applied to the unit pixel via a data-line.

BRIEF DESCRIPTION OF THE DRAWINGS

Illustrative, non-limiting exemplary embodiments will be more clearly understood from the following detailed description in conjunction with the accompanying drawings.

DETAILED DESCRIPTION OF THE EMBODIMENTS

Hereinafter, embodiments of the present inventive concept will be explained in detail with reference to the accompanying drawings.

Figure 1:
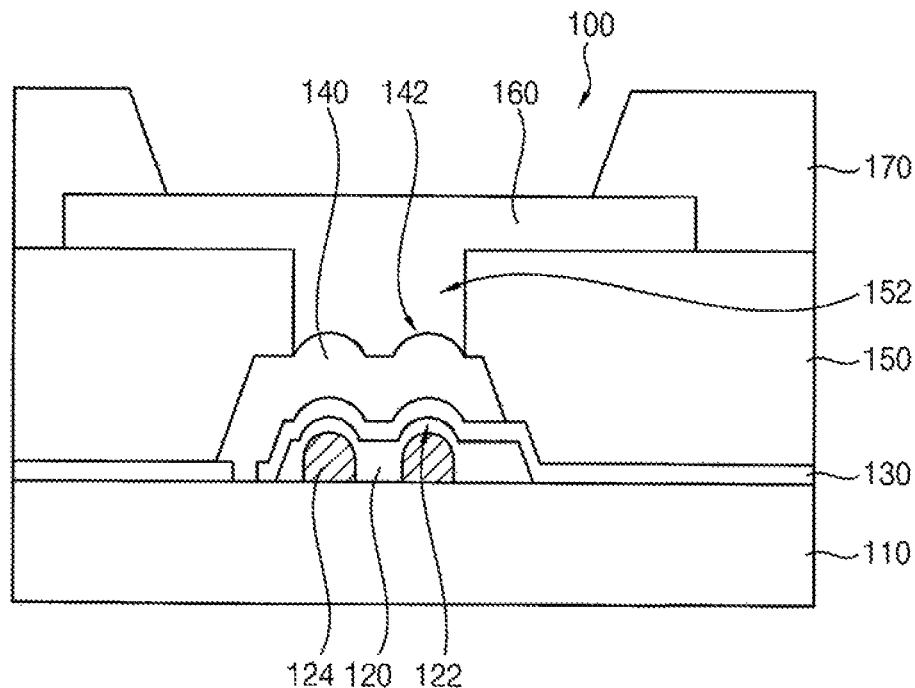
FIG. 1 is a diagram illustrating a unit pixel according to one exemplary embodiment.
Figure 2:
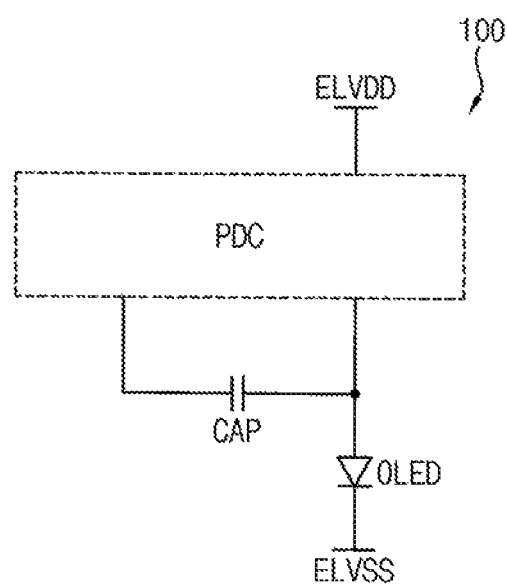
FIG. 2 is a circuit diagram illustrating an example of the unit pixel of FIG. 1.
Figure 3:
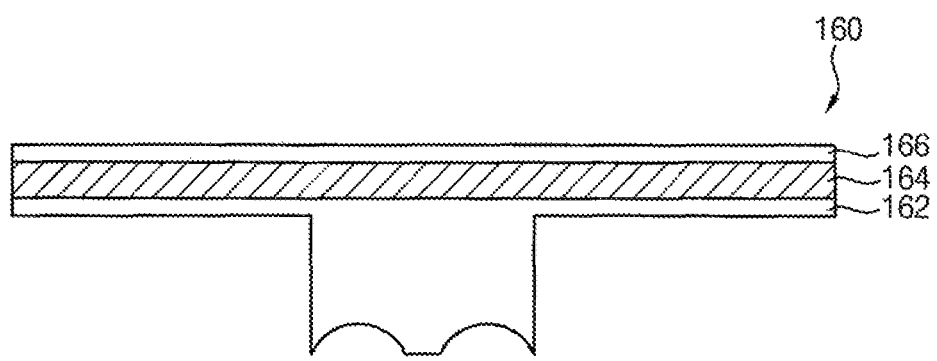
FIG. 3 is a diagram illustrating a light emission structure of the unit pixel of FIG. 1.

FIG. 1 is a diagram illustrating a unit pixel according to one exemplary embodiment. FIG. 2 is a circuit diagram illustrating an example of the unit pixel of FIG. 1. FIG. 3 is a diagram illustrating a light emission structure of the unit pixel of FIG. 1.

Referring to FIGS. 1 to 3, the unit pixel 100 may be included in an organic light emitting display device. The unit pixel 100 may include a circuit structure 110, a first wiring pattern 120, an interlayer insulating layer 130, a second wiring pattern 140, a planarization layer 150, and a light emission structure 160. The unit pixel 100 may be defined by a pixel defining layer 170. The unit pixel 100 has a capacitor CAP that is directly connected to an anode of an organic light emitting diode OLED. For convenience of description, in FIGS. 1 and 2, the unit pixel 100 is illustrated focusing on the capacitor CAP and the organic light emitting diode OLED.

The circuit structure 110 may include components such as a transistor, a capacitor, etc. As illustrated in FIG. 2, a pixel driving circuit PDC may control light emission by adjusting a current flowing through the organic light emitting diode OLED between a high voltage ELVDD and a low voltage ELVSS. Thus, the circuit structure 110 may include components for performing the operation of the pixel driving circuit PDC. The first wiring pattern 120 may be disposed on the circuit structure 110. The first wiring pattern 120 may have a first bump structure. As illustrated in FIG. 1, the first bump structure may include at least one first protrusion 122 that protrudes in an upward direction. The first bump structure may include a protrusion structure 124 that is formed on the circuit structure 110 corresponding to the first protrusion 122 and the first wiring pattern 120 that covers the protrusion structure 124. Since the first wiring pattern 120 is formed after the protrusion structure 124 is formed on the circuit structure 110, a location corresponding to the protrusion structure 124 may protrude in the upward direction when the first wiring pattern 120 is formed, such that the first protrusion 122 may be formed. In an exemplary embodiment, the protrusion structure 124 may include an organic material to prevent a defect such as an electric short circuit in a following process (e.g., a process for laminating metal patterns such as the first wiring pattern 120 and the second wiring pattern 140). For example, the protrusion structure 124 may include an organic material such as polyimide, siloxane, etc. However, the organic material for forming the protrusion structure 124 is not limited thereto. Although it is illustrated in FIG. 1 that a cross-section of the first protrusion 122 is a part of a circular shape, in some exemplary embodiments, the cross-section of the first protrusion 122 may be a part of an elliptical shape or a part of a polygonal shape.

The interlayer insulating layer 130 may cover the circuit structure 110 and the first wiring pattern 120. Since the first wiring pattern 120 includes the first protrusion 122 that protrudes in the upward direction, the interlayer insulating layer 130 that is formed on the first wiring pattern 120 may have a protrusion at a location corresponding to the first protrusion 122 in the upward direction. The second wiring pattern 140 may be disposed on the interlayer insulating layer 130. The second wiring pattern 140 may overlap the first wiring pattern 120. In addition, the second wiring pattern 140 may have a second bump structure corresponding to the first bump structure. As illustrated in FIG. 1, the second bump structure may include at least one second protrusion 142 that protrudes in the upward direction. The second bump structure may include the interlayer insulating layer 130 that is formed on the first wiring pattern 120 and the second wiring pattern 140 that is formed on the interlayer insulating layer 130. Since the interlayer insulating layer 130 that is formed on the first wiring pattern 120 has a protrusion at a location corresponding to the first protrusion 122 in the upward direction and since the second wiring pattern 140 that overlaps the first wiring pattern 120 is formed on the interlayer insulating layer 130, a location corresponding to the first protrusion 122 may protrude in the upward direction when the second wiring pattern 140 is formed, such that the second protrusion 142 may be formed. Although it is illustrated in FIG. 1 that a cross-section of the second protrusion 142 is a part of a circular shape, in some exemplary embodiments, the cross-section of the second protrusion 142 may be a part of an elliptical shape or a part of a polygonal shape. A shape of the second protrusion 142 included in the second wiring pattern 140 may be determined by a shape of the first protrusion 122 included in the first wiring pattern 120, and the shape of the first protrusion 122 included in the first wiring pattern 120 may be determined by a shape of the protrusion structure 124.

The planarization layer 150 may cover the interlayer insulating layer 130 and the second wiring pattern 140 and may include a via-hole 152 that exposes at least a portion of the second wiring pattern 140. In an exemplary embodiment, as illustrated in FIG. 1, the via-hole 152 of the planarization layer 150 may entirely expose the second protrusion 142 included in the second wiring pattern 140. In this case, the via-hole 152 may be filled with a metal (i.e., a first electrode pattern 162 of the light emission structure 160), such that the second wiring pattern 140 may contact the light emission structure 160. Thus, a stepped portion due to the second protrusion 142 of the second wiring pattern 140 may be covered by the metal in the via-hole 152 to prevent a structural distortion that may be caused by the second protrusion 142 of the second wiring pattern 140. In some exemplary embodiments, the via-hole 152 of the planarization layer 150 may expose only a portion of the second protrusion 142 of the second wiring pattern 140. The light emission structure 160 may contact the second wiring pattern 140 through the via-hole 152 of the planarization layer 150. In an exemplary embodiment, as illustrated in FIG. 3, the light emission structure 160 may include a first electrode pattern 162 (herein also referred to as a pixel electrode or an anode), an organic layer 164, and a second electrode pattern 166 (herein also referred to as an opposing electrode or a cathode). The first electrode pattern 162 may contact the second wiring pattern 140 through the via-hole 152 of the planarization layer 150. For example, the first electrode pattern 162 may be an anode of the organic light emitting diode OLED. The organic layer 164 may be disposed on the first electrode pattern 162. Specifically, the organic layer 164 may include a hole injection layer, a hole transport layer, a light emission layer, an electron transport layer, and an electron injection layer. The second electrode pattern 166 may be disposed on the organic layer 164. For example, the second electrode pattern 166 may be a cathode of the organic light emitting diode OLED. In some exemplary embodiments, the light emission structure 160 (i.e., the organic light emitting diode OLED) may have an internal resonance structure to achieve relatively high light emission efficiency. In this case, the first electrode pattern 162 or the second electrode pattern 164 of the light emission structure 160 may be a reflective electrode pattern.

As described above, in the unit pixel 100, the first wiring pattern 120, the interlayer insulating layer 130, and the second wiring pattern 140 may form the capacitor CAP illustrated in FIG. 2, the light emission structure 160 may include the organic light emitting diode OLED illustrated in FIG. 2, and the capacitor CAP may be directly connected to the anode of the organic light emitting diode OLED. In other words, the first wiring pattern 120 may correspond to one electrode of the capacitor CAP, the second wiring pattern 140 may correspond to another electrode of the capacitor CAP, and the interlayer insulating layer 130 may correspond to the dielectric layer of the capacitor CAP. Each of the first wiring pattern 120 and the second wiring pattern 140 may include a metal. Since the first wiring pattern 120 has the first bump structure, a surface area of the first wiring pattern 120 may be increased. In addition, since the second wiring pattern 140 has the second bump structure, a surface area of the second wiring pattern 140 may be increased. The capacitor CAP may include the first wiring pattern 120 including the first protrusion 122 that protrudes in the upward direction and the second wiring pattern 140 including the second protrusion 142 that protrudes in the upward direction. As a result, the capacitor CAP may have increased capacitance without changing a size of both electrodes (i.e., the first and second wiring patterns 120 and 140) of the capacitor CAP. In some exemplary embodiments, according to a structure of the unit pixel 100, the first wiring pattern 120 may be a data-line pattern through which a data signal is transferred or may be connected to the data-line pattern. In addition, the second wiring pattern 140 may be connected to an electrode of a driving transistor included in the circuit structure 110. The unit pixel 100 may have the capacitor CAP that is directly connected to the anode of the organic light emitting diode OLED and formed by the first wiring pattern 120 having the first bump structure, the interlayer insulating layer 130 that covers the first wiring pattern 120, and the second wiring pattern 140 that overlaps the first wiring pattern 120 and having the second bump structure corresponding to the first bump structure. Thus, the unit pixel 100 may effectively increase the capacitance of the capacitor CAP by increasing the surface area of both electrodes (i.e., the first wiring pattern 120 and the second wiring pattern 140) of the capacitor CAP using the first bump structure and the second bump structure without changing a size of the electrodes of the capacitor.

Figure 4:
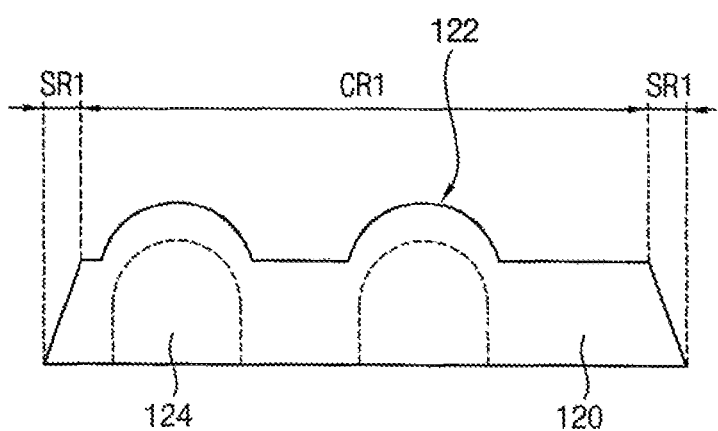
FIG. 4 is a diagram illustrating a first wiring pattern in the unit pixel of FIG. 1.
Figure 5:
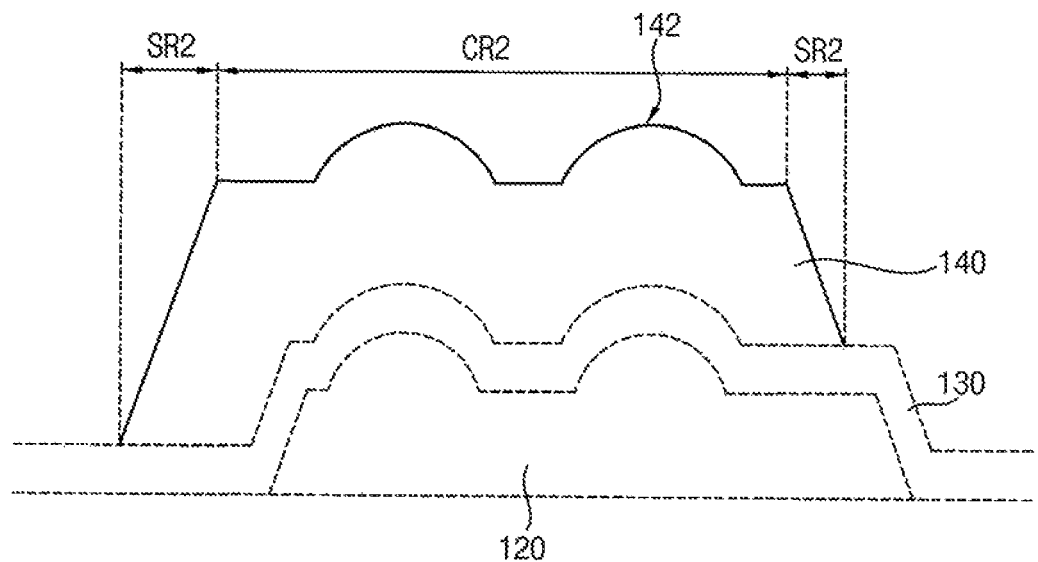
FIG. 5 is a diagram illustrating a second wiring pattern in the unit pixel of FIG. 1.

FIG. 4 is a diagram illustrating a first wiring pattern in the unit pixel of FIG. 1. FIG. 5 is a diagram illustrating a second wiring pattern in the unit pixel of FIG. 1.

Referring to FIGS. 4 and 5, the interlayer insulating layer 130 may be formed on the first wiring pattern 120 after the first wiring pattern 120 is formed, and the second wiring pattern 140 may be formed on the interlayer insulating layer 130 after the interlayer insulating layer 130 is formed.

As illustrated in FIG. 4, the first wiring pattern 120 may have a first bump structure, and the first bump structure may include at least one first protrusion 122 that protrudes in an upward direction. Since the first wiring pattern 120 is formed after a protrusion structure 124 is formed on a circuit structure 110, a location corresponding to the protrusion structure 124 may protrude in the upward direction when the first wiring pattern 120 is formed, such that the first protrusion 122 may be formed. Thus, a shape of the first protrusion 122 included in the first wiring pattern 120 may be determined by a shape of the protrusion structure 124. The first wiring pattern 120 may include a central region CR1 and a stepped portion region SR1, and the first protrusion 122 may be disposed only in the central region CR1. This is because a defect caused by the first protrusion 122 may occur in a following process if the first protrusion 122 is formed in the stepped portion region SR1. For example, in the first wiring pattern 120, the first protrusion 122 may be formed in the central region CR1 as being spaced apart from a boundary between the central region CR1 and the stepped portion region SR1 by at least more than 1 µm. As illustrated in FIG. 5, the interlayer insulating layer 130 may be formed on the first wiring pattern 120. Since the first wiring pattern 120 includes the first protrusion 122 that protrudes in the upward direction, the interlayer insulating layer 130 formed on the first wiring pattern 120 may have a protrusion at a location corresponding to the first protrusion 122 in the upward direction. The second wiring pattern 140 may be formed on the interlayer insulating layer 130. The second wiring pattern 140 may have a second bump structure, and the second bump structure may include at least one second protrusion 142 that protrudes in the upward direction. Since the interlayer insulating layer 130 formed on the first wiring pattern 120 has the protrusion at a location corresponding to the first protrusion 122 in the upward direction and since the second wiring pattern 140 that overlaps the first wiring pattern 120 is formed on the interlayer insulating layer 130, a location corresponding to the first protrusion 122 may protrude in the upward direction when the second wiring pattern 140 is formed, such that the second protrusion 142 may be formed. Thus, a shape of the second protrusion 142 included in the second wiring pattern 140 may be determined by a shape of the first protrusion 122 included in the first wiring pattern 120. The second wiring pattern 140 may include a central region CR2 and a stepped portion region SR2, and the second protrusion 142 may be disposed only in the central region CR2. This is because a defect caused by the second protrusion 142 may occur in a following process if the second protrusion 142 is formed in the stepped portion region SR2. For example, in the second wiring pattern 140, the second protrusion 142 may be formed in the central region CR2 as being spaced apart from a boundary between the central region CR2 and the stepped portion region SR2 by at least more than 1 µm. Although it is illustrated in FIGS. 4 and 5 that cross-sections of the first protrusion 122 and the second protrusion 142 are a part of a circular shape, in some exemplary embodiments, the cross-sections of the first protrusion 122 and the second protrusion 142 may be a part of an elliptical shape or a part of a polygonal shape.

Figure 6:
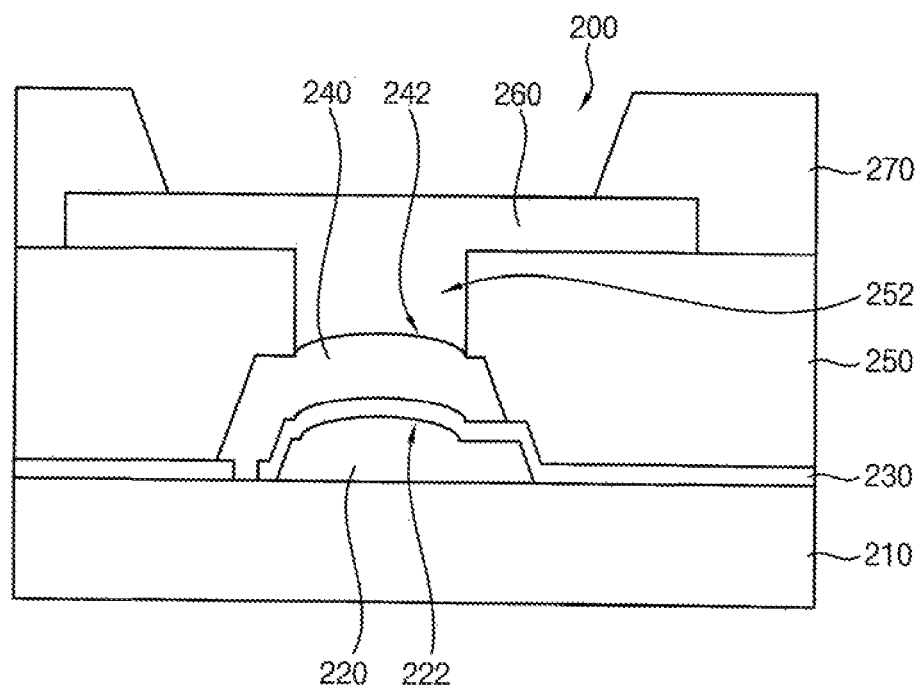
FIG. 6 is a diagram illustrating a unit pixel according to another exemplary embodiment.
Figure 7:
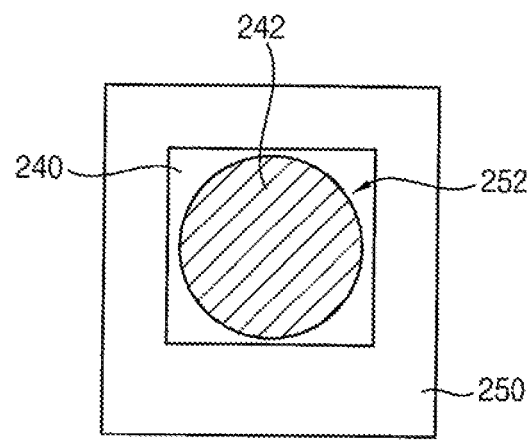
FIG. 7 is a diagram illustrating a second protrusion of a second wiring pattern shown through a via-hole of a planarization layer included in the unit pixel of FIG. 6.

FIG. 6 is a diagram illustrating a unit pixel according to another exemplary embodiment. FIG. 7 is a diagram illustrating a second protrusion of a second wiring pattern shown through a via-hole of a planarization layer included in the unit pixel of FIG. 6.

Referring to FIGS. 6 and 7, the unit pixel 200 included in an organic light emitting display device may include a circuit structure 210, a first wiring pattern 220, an interlayer insulating layer 230, a second wiring pattern 240, a planarization layer 250, and a light emission structure 260. The unit pixel 200 may be defined by a pixel defining layer 270. The unit pixel 200 has a capacitor that is directly connected to an anode of an organic light emitting diode. For convenience of description, in FIG. 6, the unit pixel 200 is illustrated focusing on the capacitor and the organic light emitting diode.

The circuit structure 210 may include components such as a transistor, a capacitor, etc. The first wiring pattern 220 may be disposed on the circuit structure 210. The first wiring pattern 220 may have a first bump structure. As illustrated in FIG. 6, the first bump structure may include at least one first protrusion 222 that protrudes in an upward direction. The first bump structure may include the first wiring pattern 220 that is formed on the circuit structure 210 and the first protrusion 222 that is formed by etching the first wiring pattern 220. The interlayer insulating layer 230 may cover the circuit structure 210 and the first wiring pattern 220. Since the first wiring pattern 220 includes the first protrusion 222 that protrudes in the upward direction, the interlayer insulating layer 230 formed on the first wiring pattern 220 may have a protrusion at a location corresponding to the first protrusion 222 in the upward direction. The second wiring pattern 240 may be disposed on the interlayer insulating layer 230. The second wiring pattern 240 may overlap the first wiring pattern 220. In addition, the second wiring pattern 240 may have a second bump structure corresponding to the first bump structure. As illustrated in FIG. 6, the second bump structure may include at least one second protrusion 242 that protrudes in the upward direction. The second bump structure may include the interlayer insulating layer 230 that is formed on the first wiring pattern 220 and the second wiring pattern 240 that is formed on the interlayer insulating layer 230. Since the interlayer insulating layer 230 that is formed on the first wiring pattern 220 has a protrusion at a location corresponding to the first protrusion 222 in the upward direction and since the second wiring pattern 240 that overlaps the first wiring pattern 220 is formed on the interlayer insulating layer 230, a location corresponding to the first protrusion 222 may protrude in the upward direction when the second wiring pattern 240 is formed, such that the second protrusion 242 may be formed. A shape of the second protrusion 242 included in the second wiring pattern 240 may be determined by a shape of the first protrusion 222 included in the first wiring pattern 220.

The planarization layer 250 may cover the interlayer insulating layer 230 and the second wiring pattern 240 and may include a via-hole 252 that exposes at least a portion of the second wiring pattern 240. In an exemplary embodiment, as illustrated in FIGS. 6 and 7, the via-hole 252 of the planarization layer 250 may entirely expose the second protrusion 242 included in the second wiring pattern 240. In this case, the via-hole 252 may be filled with a metal (i.e., a first electrode pattern 262 of the light emission structure 260), such that the second wiring pattern 240 may contact the light emission structure 260. A stepped portion caused by the second protrusion 242 of the second wiring pattern 240 may be covered by the metal in the via-hole 252 to prevent a structural distortion that may be caused by the second protrusion 242 of the second wiring pattern 240. In some exemplary embodiments, the via-hole 252 of the planarization layer 250 may expose only a portion of the second protrusion 242 of the second wiring pattern 240. The light emission structure 260 may contact the second wiring pattern 240 through the via-hole 252 of the planarization layer 250. In an exemplary embodiment, the light emission structure 260 may include a first electrode pattern, an organic layer, and a second electrode pattern. The first electrode pattern may contact the second wiring pattern 240 through the via-hole 252 of the planarization layer 250. For example, the first electrode pattern may be an anode of the organic light emitting diode. The organic layer may be disposed on the first electrode pattern. Specifically, the organic layer may include a hole injection layer, a hole transport layer, a light emission layer, an electron transport layer, and an electron injection layer. The second electrode pattern may be disposed on the organic layer. For example, the second electrode pattern may be a cathode of the organic light emitting diode. In some exemplary embodiments, the light emission structure 260 (i.e., the organic light emitting diode) may have an internal resonance structure to achieve relatively high light emission efficiency. In this case, the first electrode pattern or the second electrode pattern of the light emission structure 260 may be a reflective electrode pattern.

As described above, in the unit pixel 200, the first wiring pattern 220, the interlayer insulating layer 230, and the second wiring pattern 240 may form the capacitor, the light emission structure 260 may include the organic light emitting diode, and the capacitor may be directly connected to the anode of the organic light emitting diode. In other words, the first wiring pattern 220 may correspond to one electrode of the capacitor, the second wiring pattern 240 may correspond to another electrode of the capacitor, and the interlayer insulating layer 230 may correspond to the dielectric layer of the capacitor. Each of the first wiring pattern 220 and the second wiring pattern 240 may include a metal. Since the first wiring pattern 220 has the first bump structure, a surface area of the first wiring pattern 220 may be increased. In addition, since the second wiring pattern 240 has the second bump structure, a surface area of the second wiring pattern 240 may be increased. The capacitor may include the first wiring pattern 220 including the first protrusion 222 that protrudes in the upward direction and the second wiring pattern 240 including the second protrusion 242 that protrudes in the upward direction. As a result, the capacitor may have increased capacitance without changing a size of both electrodes (i.e., the first and second wiring patterns 220 and 240) of the capacitor. The unit pixel 200 may have the capacitor that is directly connected to the anode of the organic light emitting diode and formed by the first wiring pattern 220 having the first bump structure, the interlayer insulating layer 230 that covers the first wiring pattern 220, and the second wiring pattern 240 that overlaps the first wiring pattern 220 and having the second bump structure corresponding to the first bump structure. Thus, the unit pixel 200 may effectively increase the capacitance of the capacitor by increasing the surface area of both electrodes (i.e., the first wiring pattern 220 and the second wiring pattern 240) of the capacitor using the first bump structure and the second bump structure without changing a size of the electrodes of the capacitor.

Figure 8:
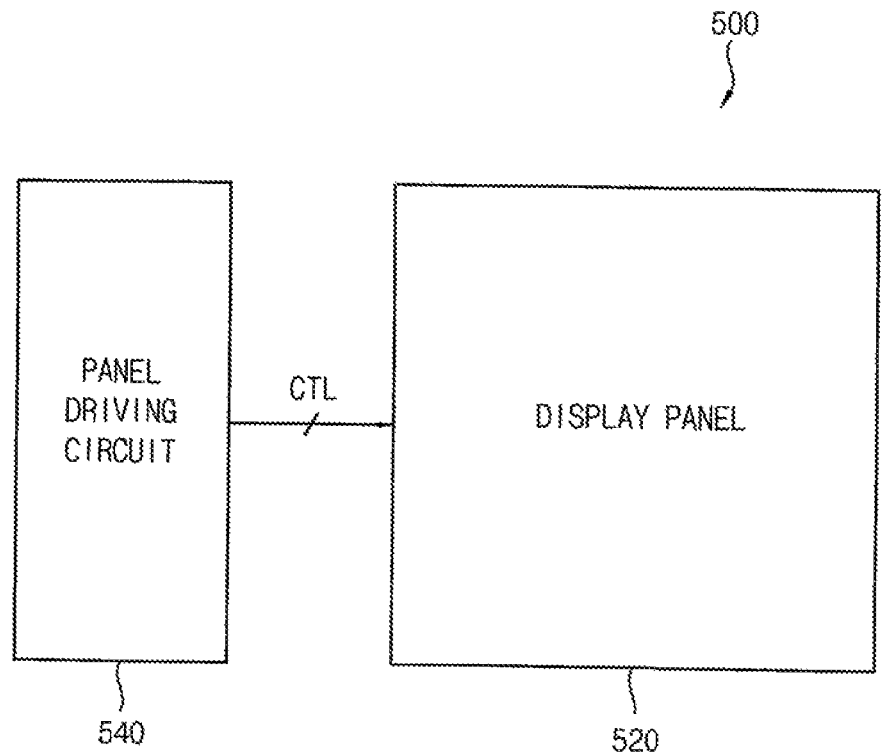
FIG. 8 is a diagram illustrating an organic light emitting display device according to one exemplary embodiment.

FIG. 8 is a diagram illustrating an organic light emitting display device according to one exemplary embodiment.

Referring to FIG. 8, the organic light emitting display device 500 may include a display panel 520 and a panel driving circuit 540 that drives the display panel 520.

The display panel 520 may include a plurality of unit pixels. Each of the unit pixels may have a capacitor that is directly connected to an anode of an organic light emitting diode. Specifically, each of the unit pixels may include a circuit structure, a first wiring pattern, an interlayer insulating layer, a second wiring pattern, a planarization layer, and a light emission structure. The first wiring pattern may be disposed on the circuit structure. The first wiring pattern may have a first bump structure. The interlayer insulating layer may cover the circuit structure and the first wiring pattern. The second wiring pattern may be disposed on the interlayer insulating layer. The second wiring pattern may overlap the first wiring pattern. The second wiring pattern may have a second bump structure corresponding to the first bump structure. The planarization layer may cover the interlayer insulating layer and the second wiring pattern. The planarization layer may include a via-hole that exposes at least a portion of the second wiring pattern. The light emission structure may contact the second wiring pattern through the via-hole. The first wiring pattern, the interlayer insulating layer, and the second wiring pattern may form the capacitor, and the light emission structure may include the organic light emitting diode. The first bump structure may include at least one first protrusion that protrudes in an upward direction. The second bump structure may include at least one second protrusion that protrudes in the upward direction. Cross-sections of the first protrusion and the second protrusion may be a part of a circular shape, a part of an elliptical shape, or a part of a polygonal shape. The display panel 520 may display an image based on lights output from the unit pixels. In an exemplary embodiment, the unit pixels included in the display panel 520 may include a red light emission pixel that outputs red light, a green light emission pixel that outputs green light, and a blue light emission pixel that outputs blue light. In another exemplary embodiment, the unit pixels included in the display panel 520 may include a red light emission pixel that outputs red light, a green light emission pixel that outputs green light, a blue light emission pixel that outputs blue light, and a white light emission pixel that outputs white light.

The panel driving circuit 540 may drive the display panel 520 by providing control signals to the display panel 520. Specifically, the panel driving circuit 540 may include a scan driver, a data driver, a timing controller, etc. The scan driver may be connected to the display panel 520 via scan-lines. The scan driver may provide a scan signal to the unit pixels of the display panel 520 via the scan-lines. The data driver may be connected to the display panel 520 via data-lines. The data driver may convert image data provided by the timing controller into a data voltage (i.e., a data signal) and then may provide the data signal to the unit pixels of the display panel 520. In some exemplary embodiments, the timing controller may receive the image data from an external component, may perform a given processing (e.g., data compensation processing, etc), and may provide processed image data to the data driver. In some exemplary embodiments, the panel driving circuit 540 may further include an emission control driver. The emission control driver may be connected to the display panel 520 via emission control-lines. The emission control driver may provide an emission control signal to the unit pixels of the display panel 520 via the emission control-lines. Although it is described above that the organic light emitting display device 500 includes the display panel 520 and the panel driving circuit 540, and the panel driving circuit 540 includes the scan driver, the data driver, the timing controller, and the emission control driver, in some exemplary embodiments, the present disclosure is not limited thereto. For example, the organic light emitting display device 500 may further include other components, for example, a deterioration compensating circuit that performs deterioration compensation for the unit pixels of the display panel 520. The organic light emitting display device 500 may include the unit pixels each including a capacitor having increased capacitance, where the capacitor includes the first wiring pattern having the first bump structure, the interlayer insulating layer covering the first wiring pattern, and the second wiring pattern overlapping the first wiring pattern and having the second bump structure corresponding to the first bump structure. Thus, the organic light emitting display device 500 may implement (or achieve) sufficient light emission luminance by reducing (or minimizing) a loss of the data signal applied to the unit pixel via the data-line. As a result, the organic light emitting display device 500 may provide a high-quality image to a viewer.

Figure 9:
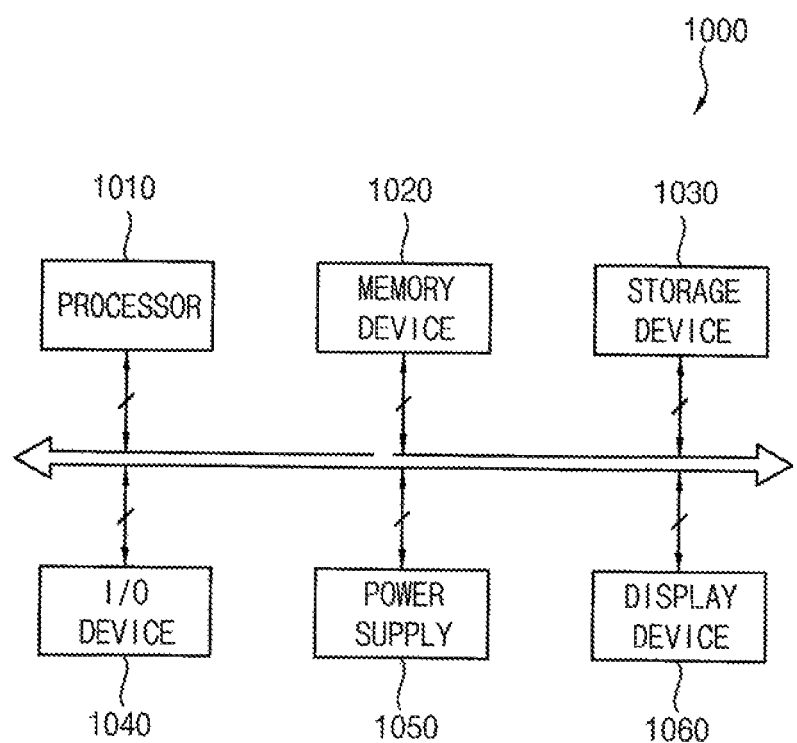
FIG. 9 is a block diagram illustrating an electronic device according to one exemplary embodiment.
Figure 10:
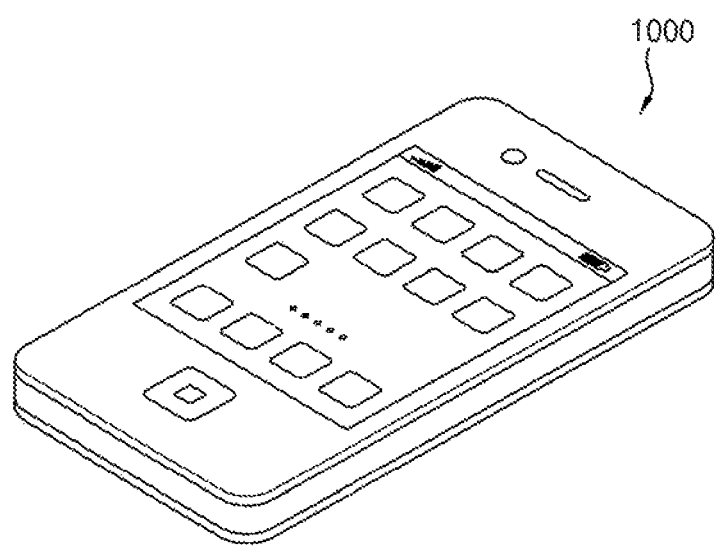
FIG. 10 is a diagram illustrating an example in which the electronic device of FIG. 9 is implemented as a smart phone.

FIG. 9 is a block diagram illustrating an electronic device according to one exemplary embodiment. FIG. 10 is a diagram illustrating an example in which the electronic device of FIG. 9 is implemented as a smart phone.

Referring to FIGS. 9 and 10, the electronic device 1000 may include a processor 1010, a memory device 1020, a storage device 1030, an input/output (I/O) device 1040, a power supply 1050, and an organic light emitting display device 1060. The organic light emitting display device 1060 may be the organic light emitting display device 500 of FIG. 8. In addition, the electronic device 1000 may further include a plurality of ports for communicating with a video card, a sound card, a memory card, a universal serial bus (USB) device, other electronic devices, etc. In an exemplary embodiment, as illustrated in FIG. 10, the electronic device 1000 may be implemented as a smart phone. However, the electronic device 1000 is not limited thereto. For example, the electronic device 1000 may be implemented as a television, a cellular phone, a video phone, a smart pad, a smart watch, a tablet PC, a car navigation system, a computer monitor, a laptop, a head mounted display (HMD) device, etc.

The processor 1010 may perform various computing functions. The processor 1010 may be a micro processor, a central processing unit (CPU), an application processor (AP), etc. The processor 1010 may be coupled to other components via an address bus, a control bus, a data bus, etc. Further, the processor 1010 may be coupled to an extended bus such as a peripheral component interconnection (PCI) bus. The memory device 1020 may store data and instructions for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 1030 may be a solid-state drive (SSD) device, a hard disk drive (HDD) device, a CD-ROM device, etc. The I/O device 1040 may include an input device such as a keyboard, a keypad, a mouse device, a touchpad, a touch-screen, a remote controller, etc. and an output device such as a printer, a speaker, etc. In some exemplary embodiments, the organic light emitting display device 1060 may be included in the I/O device 1040. The power supply 1050 may provide power for operations of the electronic device 1000.

The organic light emitting display device 1060 may be coupled to other components via the buses or other communication links. As described above, the organic light emitting display device 1060 may include a display panel including a plurality of unit pixels and a panel driving circuit that drives the display panel. Each of the unit pixels may have a capacitor that is directly connected to an anode of an organic light emitting diode. Specifically, each of the unit pixels may include a circuit structure, a first wiring pattern, an interlayer insulating layer, a second wiring pattern, a planarization layer, and a light emission structure. The first wiring pattern may be disposed on the circuit structure. The first wiring pattern may have a first bump structure. The interlayer insulating layer may cover the circuit structure and the first wiring pattern. The second wiring pattern may be disposed on the interlayer insulating layer. The second wiring pattern may overlap the first wiring pattern and may have a second bump structure corresponding to the first bump structure. The planarization layer may cover the interlayer insulating layer and the second wiring pattern. The planarization layer may include a via-hole that expose at least a portion of the second wiring pattern. The light emission structure may contact the second wiring pattern through the via-hole. The first wiring pattern, the interlayer insulating layer, and the second wiring pattern may form the capacitor, and the light emission structure may include the organic light emitting diode. The first bump structure may include at least one first protrusion that protrudes in an upward direction. The second bump structure may include at least one second protrusion that protrudes in the upward direction. In exemplary embodiments, cross-sections of the first protrusion and the second protrusion may be a part of a circular shape, a part of an elliptical shape, or a part of a polygonal shape. In each of the unit pixels, the capacitor may be formed by the first wiring pattern having the first bump structure, the interlayer insulating layer covering the first wiring pattern, and the second wiring pattern overlapping the first wiring pattern and having the second bump structure corresponding to the first bump structure. Thus, the capacitance of the capacitor included in each of the unit pixels may be effectively increased by increasing a surface area of both electrodes (i.e., the first wiring pattern and the second wiring pattern) of the capacitor using the first bump structure and the second bump structure without changing a size of the electrodes of the capacitor. As a result, the organic light emitting display device 1060 including the unit pixel may implement sufficient light emission luminance by reducing a loss of a data signal applied to the unit pixel via a data-line. Since these are described above, duplicated description related thereto will not be repeated.

The present inventive concept may be applied to an organic light emitting display device and an electronic device including the organic light emitting display device. For example, the present inventive concept may be applied to a cellular phone, a smart phone, a video phone, a smart pad, a smart watch, a tablet PC, a car navigation system, a television, a computer monitor, a laptop, a digital camera, an HMD device, etc.

The foregoing is illustrative of exemplary embodiments and is not to be construed as limiting thereof. Although a few exemplary embodiments have been described, those skilled in the art will readily appreciate that deviations and modifications are possible in the exemplary embodiments without materially departing from the novel teachings and advantages of the present inventive concept. Accordingly, such deviations and modifications are intended to be included within the scope of the present inventive concept of the present disclosure. Therefore, it is to be understood that the foregoing is illustrative of various exemplary embodiments and is not to be construed as limited to the specific exemplary embodiments disclosed, and that deviations and modifications to the disclosed exemplary embodiments, as well as other exemplary embodiments, are intended to be included within the scope of the present disclosure.

What is claimed is:

1. An organic light emitting display device comprising:
a display panel including a plurality of unit pixels; and
a panel driving circuit configured to drive the display panel,
wherein each of the unit pixels includes:
 a circuit structure;
 a first wiring pattern disposed on the circuit structure, the first wiring pattern having a first bump structure;
 an interlayer insulating layer covering the circuit structure and the first wiring pattern;
 a second wiring pattern disposed on the interlayer insulating layer, the second wiring pattern overlapping the first wiring pattern and having a second bump structure corresponding to the first bump structure;
 a planarization layer covering the interlayer insulating layer and the second wiring pattern and including a via-hole that exposes at least a portion of the second wiring pattern; and
 a light emission structure contacting the second wiring pattern through the via-hole,
wherein the first wiring pattern, the interlayer insulating layer, and the second wiring pattern form a capacitor, the light emission structure includes an organic light emitting diode, and the capacitor is directly connected to an anode of the organic light emitting diode, and
wherein the second bump structure includes at least one second protrusion that protrudes in an upward direction, and the at least one second protrusion of the second bump structure is entirely contained in an area that is exposed by the via-hole in a plan view.

2. The organic light emitting display device of claim 1, wherein the first bump structure includes at least one first protrusion that protrudes in the upward direction, and cross-sections of the first protrusion and the second protrusion are a part of a circular shape, a part of an elliptical shape, or a part of a polygonal shape.

3. An organic light emitting display device comprising:
a display panel including a plurality of unit pixels; and
a panel driving circuit configured to drive the display panel,
wherein each of the unit pixels includes:
 a circuit structure;
 a first wiring pattern disposed on the circuit structure, the first wiring pattern having a first bump structure;
 an interlayer insulating layer covering the circuit structure and the first wiring pattern;
 a second wiring pattern disposed on the interlayer insulating layer, the second wiring pattern overlapping the first wiring pattern and having a second bump structure corresponding to the first bump structure;
 a planarization layer covering the interlayer insulating layer and a first portion of the second wiring pattern and including a via-hole that exposes a second portion of the second wiring pattern; and
 a light emission structure contacting the second wiring pattern through the via-hole,
wherein the first wiring pattern, the interlayer insulating layer, and the second wiring pattern form a capacitor, the light emission structure includes an organic light emitting diode, and the capacitor is directly connected to an anode of the organic light emitting diode,
wherein the first bump structure of the first wiring pattern includes at least one first protrusion that protrudes in an upward direction,
wherein the second bump structure of the second wiring pattern includes at least one second protrusion that protrudes in the upward direction,
wherein the second protrusion of the second bump structure is entirely contained in an area that is exposed by the via-hole in a plan view,
wherein the first wiring pattern is disposed on a protrusion structure that is formed on the circuit structure, and
wherein the first protrusion comprises a portion of the first wiring pattern that covers the protrusion structure.

4. The organic light emitting display device of claim 3, wherein the first wiring pattern includes a central region and a stepped portion region, and the first protrusion is disposed only in the central region.

5. The organic light emitting display device of claim 3, wherein the protrusion structure includes an organic material.

6. The organic light emitting display device of claim 5, wherein the organic material includes at least one of polyimide and siloxane.

7. The organic light emitting display device of claim 3, wherein a cross-section of the first protrusion is a part of a circular shape, a part of an elliptical shape, or a part of a polygonal shape.

8. The organic light emitting display device of claim 3, wherein the second wiring pattern includes a central region and a stepped portion region, and the second protrusion is disposed only in the central region.

9. The organic light emitting display device of claim 3, wherein the second protrusion of the second bump structure is disposed on a portion of the interlayer insulating layer that is formed on a first protrusion of the first bump structure.

10. The organic light emitting display device of claim 3, wherein a cross-section of the second protrusion is a part of a circular shape, a part of an elliptical shape, or a part of a polygonal shape.

11. The organic light emitting display device of claim 3, wherein the first wiring pattern is a data-line pattern or is connected to a data-line pattern.

12. The organic light emitting display device of claim 11, wherein the second wiring pattern is connected to one electrode of a driving transistor that is included in the circuit structure.

13. The organic light emitting display device of claim 12, wherein the first wiring pattern and the second wiring pattern include a metal.

14. The organic light emitting display device of claim 12, wherein the light emission structure includes:
 a first electrode pattern contacting the second wiring pattern through the via-hole, the first electrode pattern corresponding to the anode of the organic light emitting diode;
 an organic layer disposed on the first electrode pattern; and a second electrode pattern disposed on the organic layer, the second electrode pattern corresponding to a cathode of the organic light emitting diode.

\* \* \* \* \*